United States Patent [19]

Baba

[11] Patent Number: 5,303,192
[45] Date of Patent: Apr. 12, 1994

[54] SEMICONDUCTOR MEMORY DEVICE HAVING INFORMATION INDICATIVE OF PRESENCE OF DEFECTIVE MEMORY CELL

[75] Inventor: Fumio Baba, Kawasaki, Japan

[73] Assignee: Fujitsu Limited, Kawasaki, Japan

[21] Appl. No.: 831,662

[22] Filed: Feb. 6, 1992

Related U.S. Application Data

[63] Continuation of Ser. No. 493,433, Mar. 14, 1990, abandoned.

Foreign Application Priority Data

Mar. 14, 1990 [JP] Japan .................. 1-68404

[51] Int. Cl.$^5$ .................. G11C 7/00; G06F 11/16
[52] U.S. Cl. .................. 365/200; 364/264.1;
364/268.5; 364/966.3; 365/189.01; 365/230.03;
365/230.04; 371/10.1; 371/10.2; 371/21.1
[58] Field of Search ............... 365/200, 230.03, 230.04,
365/189.01; 371/21.1, 10.1, 10.2

[56] References Cited

U.S. PATENT DOCUMENTS

| | | | |
|---|---|---|---|
| 3,693,159 | 9/1972 | Hilberg | 340/172.5 |
| 3,772,652 | 11/1973 | Hilberg | 340/172.5 |
| 4,089,063 | 5/1978 | Takezono et al. | 365/200 |
| 4,750,158 | 6/1988 | Gubel et al. | 365/200 |
| 4,803,656 | 2/1989 | Takemae | 365/200 |
| 4,858,192 | 8/1989 | Tatsumi et al. | 365/200 |
| 4,926,385 | 5/1990 | Fujishima et al. | 365/230.03 |
| 4,951,253 | 8/1990 | Sahara et al. | 365/200 |

FOREIGN PATENT DOCUMENTS

| | | |
|---|---|---|
| 3317160 | 11/1983 | Fed. Rep. of Germany . |
| 87/3716 | 6/1987 | PCT Int'l Appl. . |
| 2154032 | 8/1985 | United Kingdom . |

*Primary Examiner*—Joseph L. Dixon
*Attorney, Agent, or Firm*—Staas & Halsey

[57] ABSTRACT

A semiconductor memory device storing data having a unit of N bits (N is an integer) includes M memory elements (M is an integer and larger than N) each divided into a plurality of blocks each having a plurality of memory cells each storing one-bit data, and M internal bus lines each carrying one-bit data and connected to a corresponding one of the M memory elements. A designating circuit receives an address signal from an external device and designates one of the plurality of blocks of each of the M memory elements so that M blocks are designated by the address signal. A ROM stores information on whether or not each of the plurality of blocks of each of the M memory elements has a defective memory cell and outputs the information in accordance with the address signal. N external bus lines individually carry one-bit data. A bus line switching circuit determines whether each of the M blocks designated by the designating circuit has a defective memory cell by referring to the information from the ROM, and selectively connects N internal bus lines among the M internal bus lines to the N external bus lines so that one of the M blocks which has a defective memory cell is prevented from being selected and another one of the M blocks is selected.

23 Claims, 11 Drawing Sheets

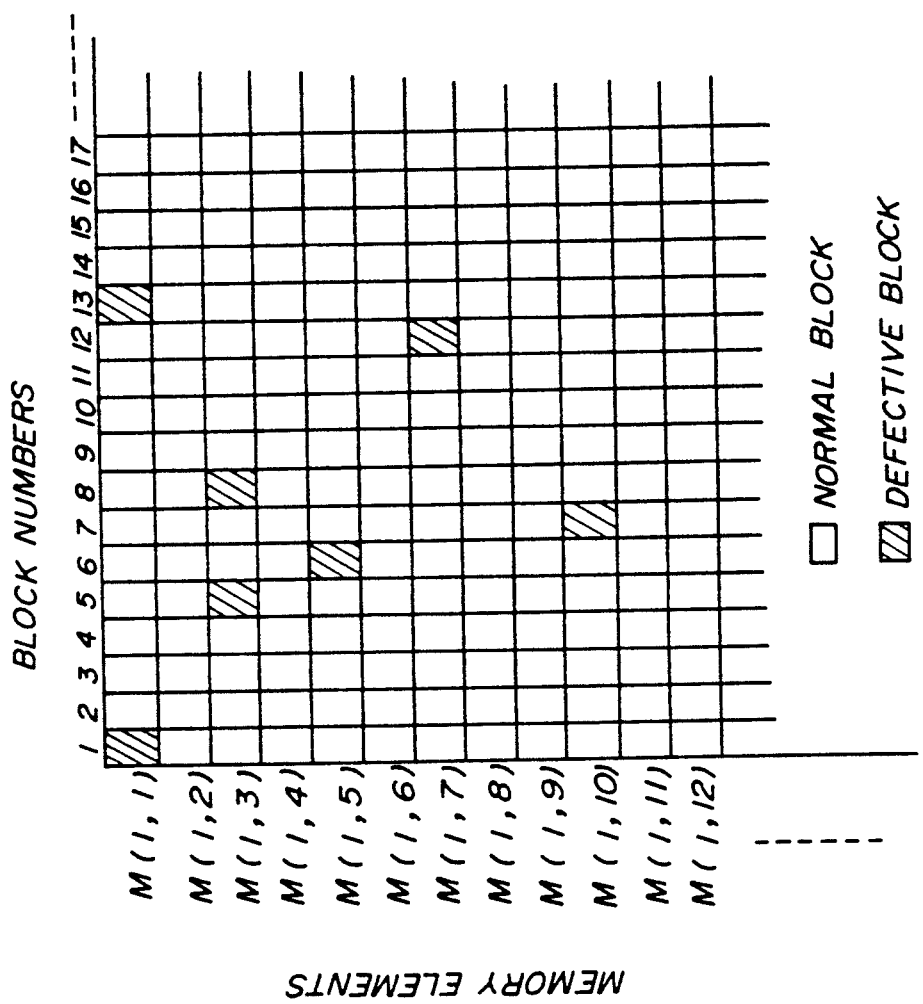

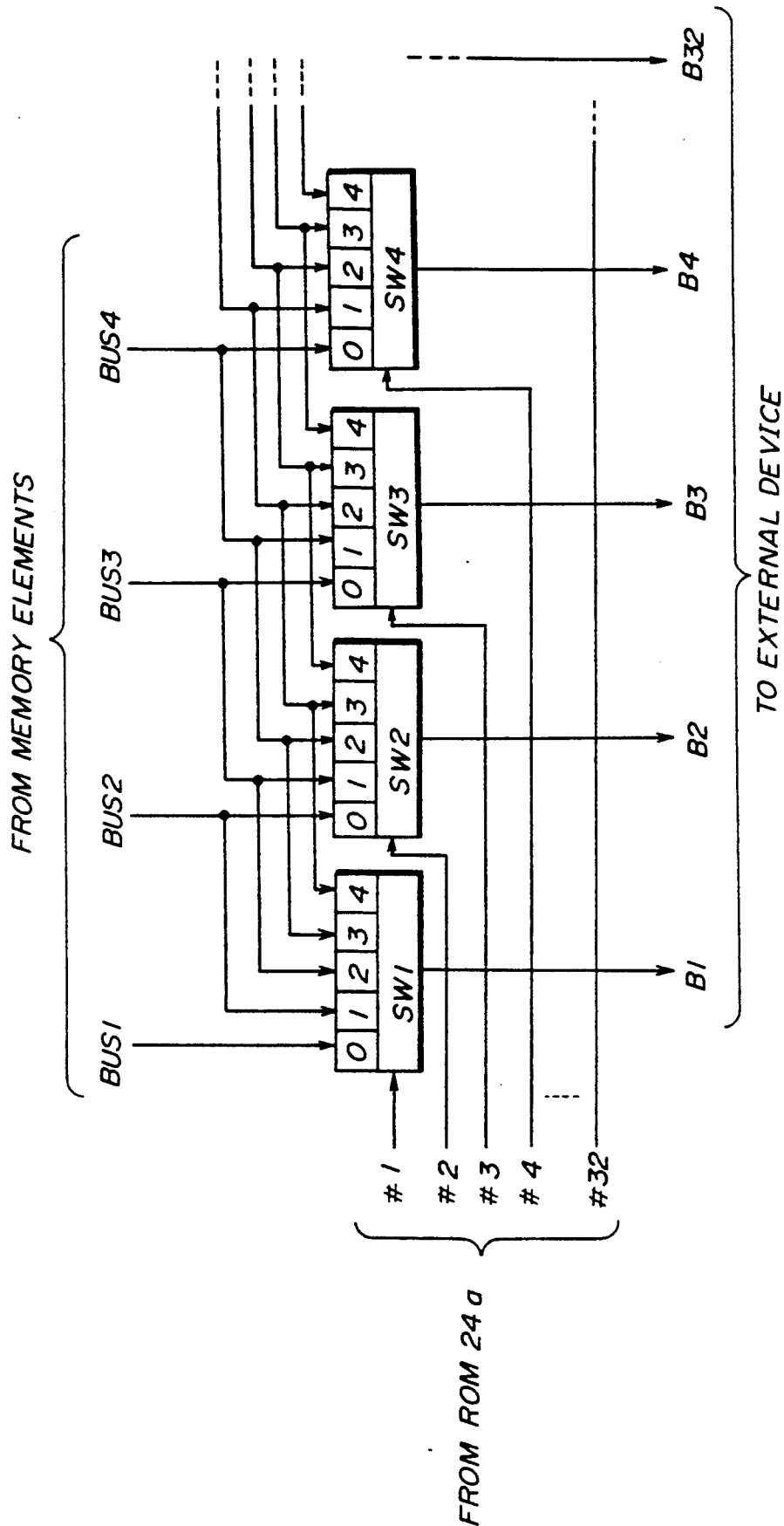

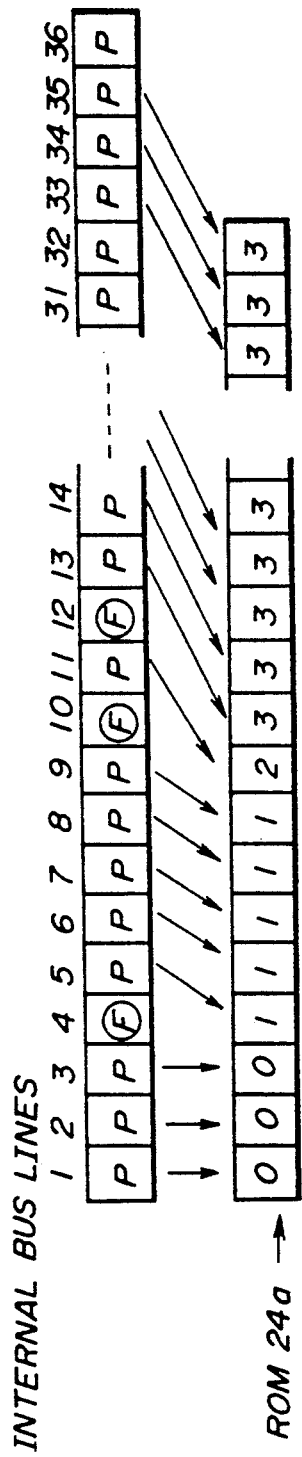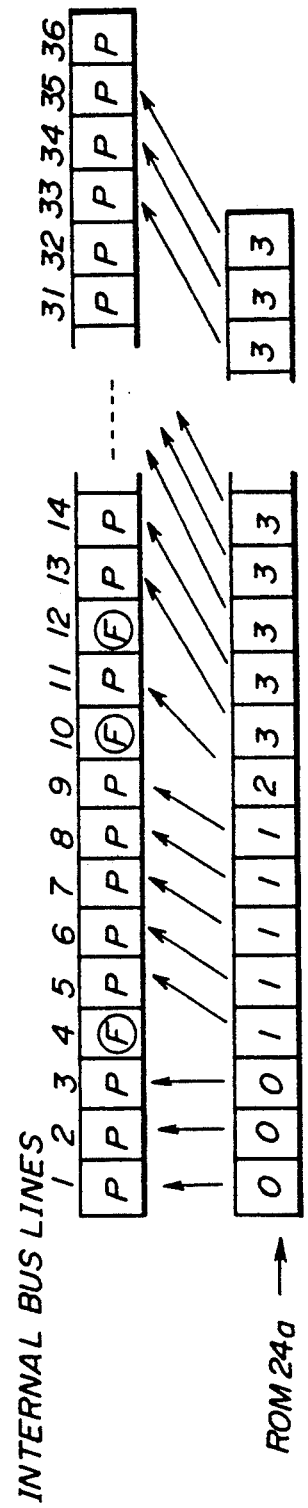

SEMICONDUCTOR MEMORY DEVICE HAVING INFORMATION INDICATIVE OF PRESENCE OF DEFECTIVE MEMORY CELL

This application is a continuation of application Ser. No. 07/493,433, filed Mar. 14, 1990, now abandoned.

BACKGROUND OF THE INVENTION

The present invention generally relates to a semiconductor memory device, and particularly to a large capacity semiconductor memory device suitable for a storage device in a large-scale computer system. More particularly, the present invention is concerned with a semiconductor memory device having information indicative of the presence of defective memory cells (bits).

Conventionally, much effort to improve the production yield of semiconductor devices is being made. Presently, a technique which realizes 100% production yield is not available. It is possible to use only semiconductor memory devices having no defective memory cells. However, the number of defective memory cells increases with an increase in storage capacity and thus it is difficult to obtain a large number of semiconductor memory devices having no defective memory cells. From this point of view, a semiconductor memory device having redundant bits has been proposed. Such a semiconductor memory device has a memory cell array which is divided into a main memory cell array and a redundant memory cell array. Memory cells in the main memory cell are investigated by a conventional wafer probing test, and defective memory cells are detected. The detected defective memory cells are stored in a ROM (read only memory) provided in the semiconductor memory device. When a defective memory cell in the main memory cell array is addressed, a redundant bit in the redundant cell array is actually accessed instead of the addressed defective memory cell.

FIG. 1 is a block diagram of a conventional semiconductor memory device. The semiconductor memory device in FIG. 1 includes a memory cell array 10, which is divided into a main memory cell array 10a and a redundant memory cell array 10b. The main memory cell array 10a is accessed by a column decoder 11 and a row decoder 12a. The redundant memory cell array 10b is accessed by a redundant row decoder 12b and the column decoder 11. Normally, an address signal from an external circuit (not shown) such as a central processing unit (CPU) is supplied to the column decoder 11, and the row decoder 12a through a controller 13 and a switching circuit 14. Data are read out from or written into memory cells of the main memory cell array 10a corresponding to the address signal. The controller 13 compares the address signal with addresses stored in a read only memory (ROM) 13a. When it is determined that the address signal indicates a group of memory cells including a defective memory cell, the switching circuit 14 supplies the address signal from the controller 13 to the redundant row decoder 12b. A group of memory cells to be substituted for the group of memory cells having the defective memory cell is accessed by the column decoder 11 and the redundant row decoder 12b. Such a replacement is carried out in a row unit.

Memory cells forming the redundant memory cell array 10b must have no defective cells. Thus, the redundant memory cell 10b array is configured by only a limited number of memory cells having no defect. As a result, the redundant memory cell array 10b can save a limited number of defective memory cells in the main memory cell array 10a. In order to provide a large capacity less-expensive semiconductor memory device for use in a large-scale computer system, it is desired that a semiconductor memory device having a large number of defective memory cells be used. The conventional configuration shown in FIG. 1 cannot satisfy such a desire. In some cases, a large number of the elements each having the configuration shown in FIG. 1 is used for providing a large capacity semiconductor memory. In this arrangement, each element has the controller 13, the ROM 13a and the switching circuit 14. This prevents the memory device from being compactly made and operating at high speeds.

SUMMARY OF THE INVENTION

It is a general object of the present invention to provide an improved semiconductor memory device in which the aforementioned disadvantages are eliminated.

A more specific object of the present invention is to provide a less-expensive semiconductor memory device in which memory elements including defective memory cells are selectively and efficiently replaced by normal memory elements.

The above-mentioned objects of the present invention are achieved by a semiconductor memory device storing data having a unit of N bits (N is an integer), comprising M memory elements (M is an integer and larger than N) each divided into a plurality of blocks each having a plurality of memory cells each storing one-bit data; and M internal bus lines each carrying one-bit data and connected to a corresponding one of the M memory elements. The semiconductor memory device also comprises designating means, coupled to the M memory elements, for receiving an address signal from an external device and for designating one of the plurality of blocks of each of the M memory elements so that M blocks are designated by the address signal; and memory means for storing information on whether or not each of the plurality of blocks of each of the M memory elements has a defective memory cell and for outputting the information in accordance with the address signal. The semiconductor memory device further comprises N external bus lines each carrying one-bit data; and bus line switching means, provided between the M internal bus lines and N external bus lines and connected to the memory means, for determining whether each of the M blocks designated by the designating means has a defective memory cell by referring to the information from the memory means and for selectively connecting N internal bus lines among the M internal bus lines to the N external bus lines so that one of the M blocks which has a defective memory cell is prevented from being selected and another one of the M blocks is selected.

The aforementioned objects of the present invention are also achieved by a semiconductor memory device storing data having a unit of N bits (N is an integer), comprising n×M memory elements (n is an integer, and M is an integer and larger than N) each divided into a plurality of blocks each having a plurality of memory cells each storing one-bit data; M internal bus lines each carrying one-bit data and connected to corresponding n memory elements among the n×M memory elements so that the n×M memory elements are arranged into a matrix; and designating means, coupled to the n×M memory elements, for receiving an address signal from an external device and for designating one of the plurality of blocks of each of the n×M memory elements so that M blocks are designated by the address signal. The semiconductor memory device also comprises memory means for storing information on whether or not each of the plurality of blocks of each of the n×M memory elements has a defective memory cell and for outputting the information in accordance with the address signal; and N external bus lines each carrying one-bit data. The semiconductor memory device further comprises bus line switching means, provided between the M internal bus lines and N external bus lines and connected to the memory means, for determining whether each of the M blocks designated by the designating means has a defective memory cell by referring to the information from the memory means and for selectively connecting N internal bus lines among the M internal bus lines to the N external bus lines so that one of the M blocks which has a defective memory cell is prevented from being selected and another one of the M blocks is selected.

The aforementioned objects of the present invention are also achieved by a semiconductor memory device storing data having a unit of N bits (N is an integer), comprising n×M memory elements (n is an integer, and M is an integer and larger than N) each divided into a plurality of blocks each having a plurality of memory cells each storing one-bit data; M internal bus lines each carrying one-bit data and connected to corresponding n memory elements among the n×M memory elements so that the n×M memory elements are arranged into a matrix; and designating means, coupled to the n×M memory elements, for receiving an address signal from an external device and for designating one of the plurality of blocks of each of the n×M memory elements so that M blocks are designated by the address signal. The semiconductor memory device also comprises memory means for storing information on whether or not each of the plurality of blocks of each of the n×M memory elements has a defective memory cell and for outputting the information in accordance with the address signal; determining means, connected to the memory means, for determining whether each of the M blocks designated by the designating means has a defective memory cell by referring to the information from the memory means and for outputting a control signal indicative of the results of the determination; and serial data inputting means, coupled to the determining means, for receiving serial write data and for selectively outputting the serial write data bit by bit in accordance with the control signal from the determining means. The semiconductor memory device further comprises serial/parallel converting means, connected to the M internal bus lines and the serial data inputting means, for converting the serial write data into parallel write data to be supplied to the M internal bus lines and for converting readout data from the M internal bus lines into serial readout data; and serial data outputting means, coupled to the determining means and the serial/parallel converting means, for selectively receiving the serial readout data bit by bit in accordance with the control signal from the determining means and for outputting the serial readout data to an external bus line in serial form.

Additional objects, features and advantages of the present invention will become apparent from the following detailed description when read in conjunction with the accompanying drawings.

BRIEF DESCRIPTION OF THE DRAWINGS

FIG. 5 is a diagram illustrating a map formed in a ROM shown in FIG. 3;

FIG. 8 is a block diagram of a part of a switch circuit provided in the bit line switching circuit shown in FIG. 3;

FIG. 9 is a diagram showing the relationship between the status of accessed blocks obtained on internal bus lines shown in FIG. 3 and the related contents of the ROM shown in FIG. 3;

FIG. 11 is a diagram showing the relationship between the status of accessed blocks obtained on the internal bus lines shown in FIG. 3 and the related contents of the ROM shown in FIG. 3;

DESCRIPTION OF THE PREFERRED EMBODIMENTS

Figure 1:
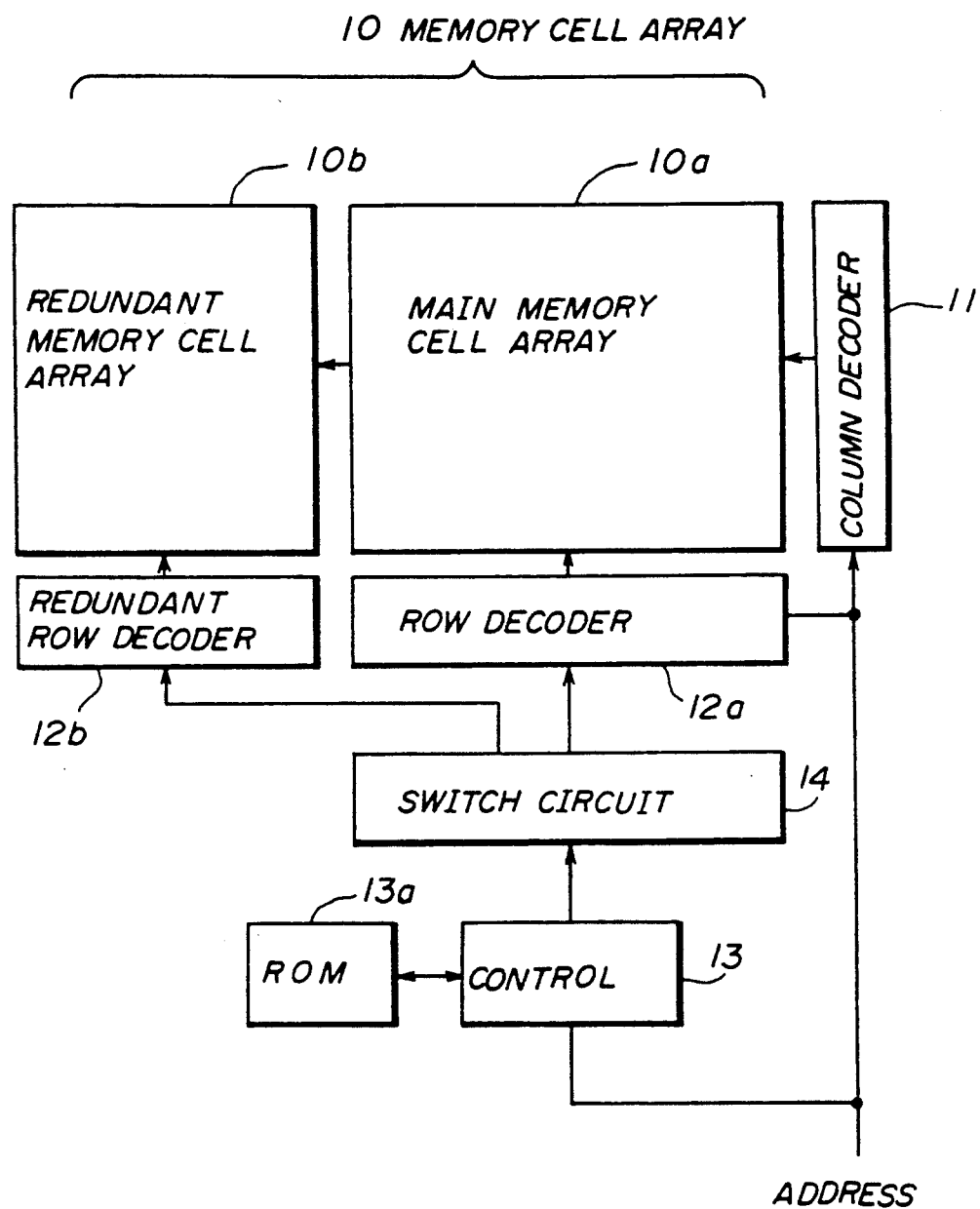
FIG. 1 is a block diagram of a conventional semiconductor memory device having a redundant memory cell array.
Figure 2:
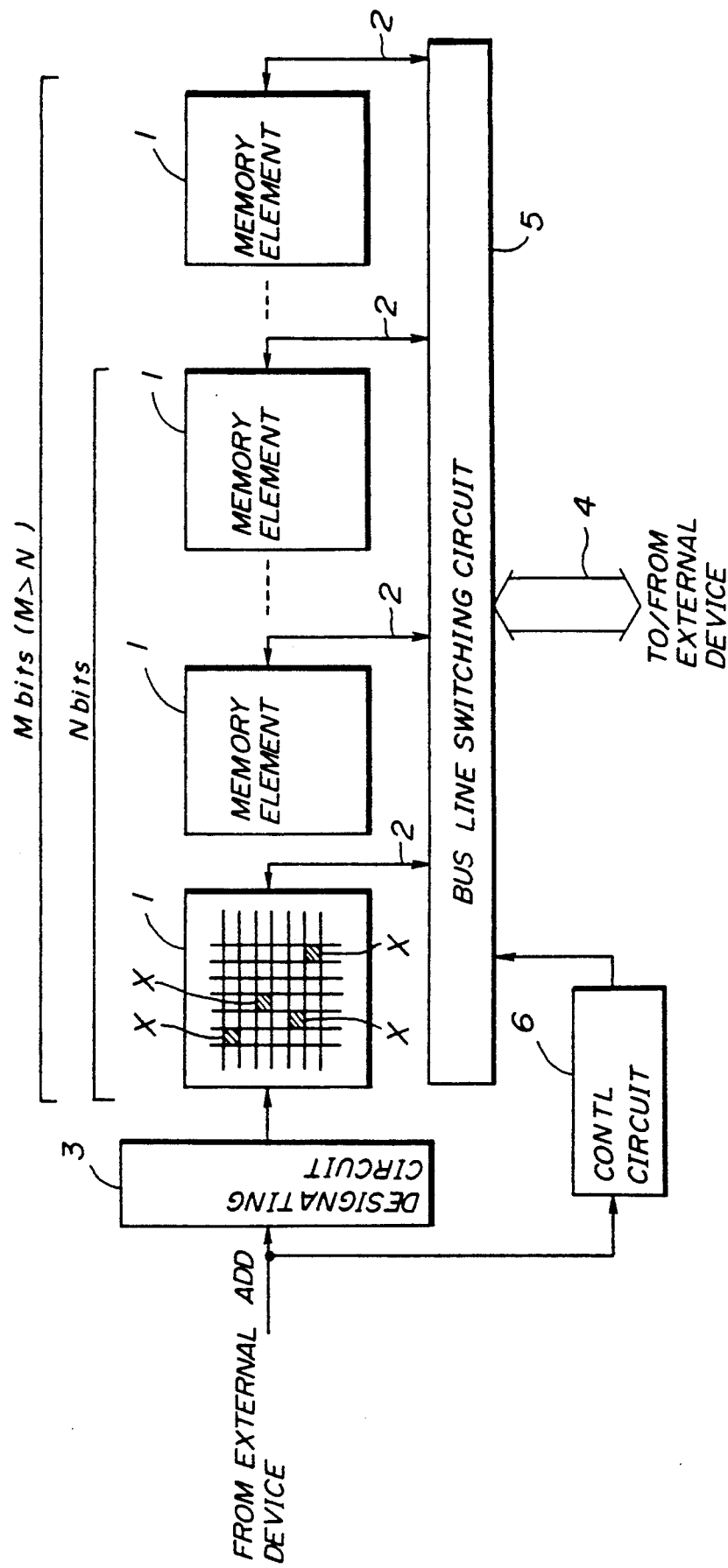
FIG. 2 is a block diagram illustrating a general structure of a semiconductor memory device according to the present invention.

Referring to FIG. 2, there is illustrated a general configuration of a semiconductor memory device according to the present invention. The memory device shown in FIG. 2 stores data consisting of a number N of bits per unit. The memory device includes M (M>N) number of semiconductor memory elements 1, from which M internal bus lines 2 each carrying one-bit data extend individually. A designating circuit 3 receives an address ADD and designates a corresponding area (memory cell) of each memory element 1. A bus line switching circuit 5 receives M-bit data from the memory elements 1 and selects N bits from among M bits under the control of a control circuit 6, which receives the address signal ADD. The control circuit 6 includes a ROM (not shown). The ROM has storage areas individually provided for the memory elements 1. The area of each memory element is divided into a plurality of blocks each having a predetermined size equal to at least one memory cell. Information is written into the storage area provided for each of the blocks of each memory cell. Information about each block indicates whether each block being considered has a defective memory cell. In FIG. 2, the memory elements next to the designating circuit 3 has hatched blocks X each having a defective memory cell. The ROM stores such information in the form of a map, as will be described later. The bus line switching circuit 5 selectively connects N bits among M bits to the N external bus lines 4 under the control of the control circuit 6. For example, when the address signal ADD has address information indicative of a defective block (block having a defective memory cell) in the memory element 1 next to the designating circuit 3, this is detected by the control circuit 6 by referring to the built-in ROM. Then the control circuit 6 controls the bus line switching circuit 5 so that it selects another memory element 1 instead of the accessed memory element having the above-mentioned defective block. In this manner, the bus line switching circuit 5 selects N memory elements 1 from among M memory elements 1 so that memory elements having defective blocks are not selected. It is noted that the designating circuit 3, the bus line switching circuit 5 and the control circuit 6 having the ROM are provided in common to the M memory elements 1.

Figure 3:
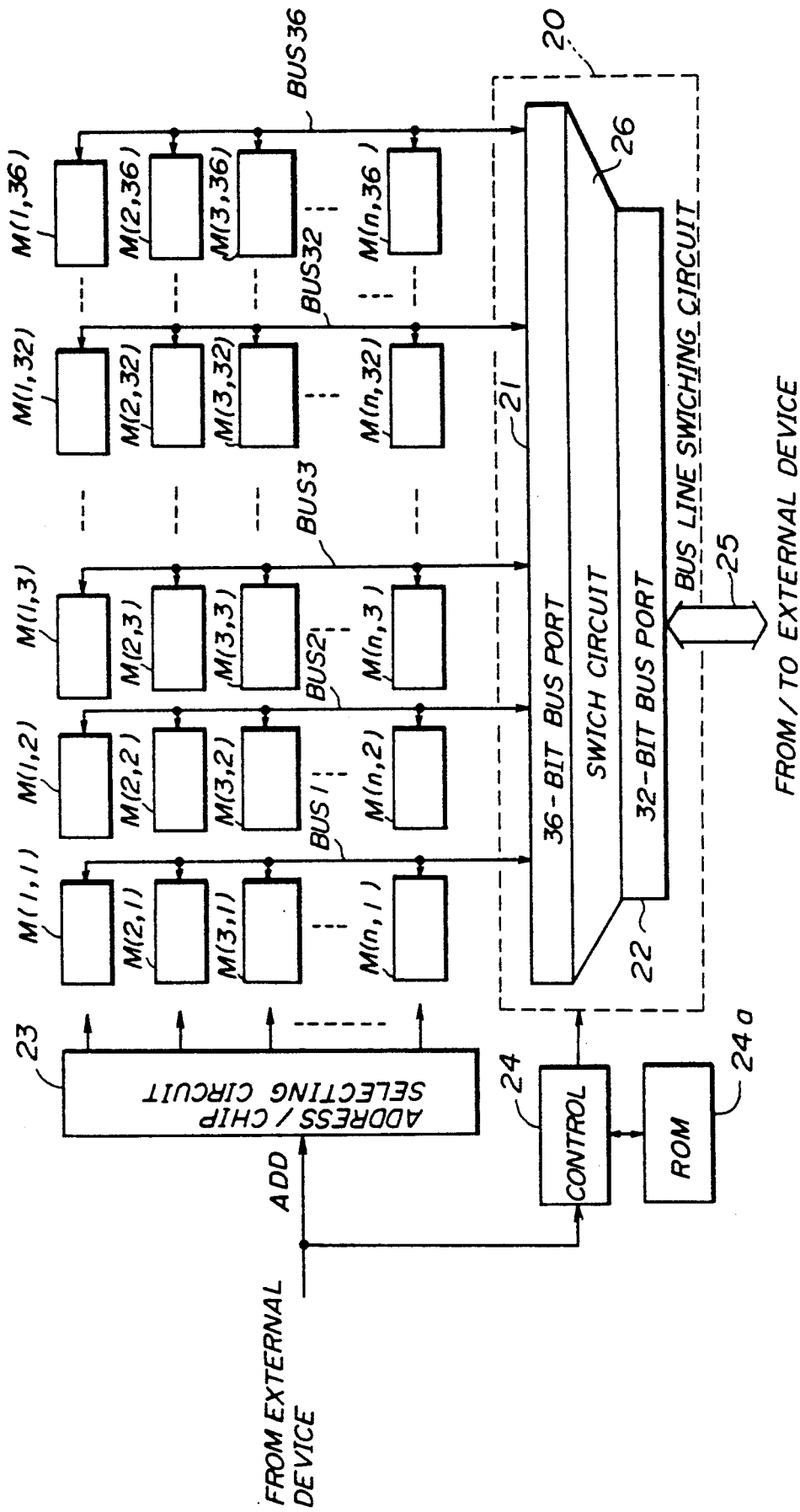
FIG. 3 is a block diagram of a semiconductor memory device according to a first preferred embodiment of the present invention.

A description will be given of a semiconductor memory device according to a first preferred embodiment of the present invention. FIG. 3 is a block diagram of a general structure of the semiconductor memory device according to the first embodiment of the present invention. The configuration shown in FIG. 3 stores data having a unit that consists of 32 bits. The memory device shown in FIG. 3 includes 36×M semiconductor memory elements M(1, 1), M(1, 2), . . . , M(n, 36) arranged into a matrix where n is an integer. The memory elements are integrated circuit blocks or semiconductor chips. For example, 36×M integrated circuit blocks are arranged on a wafer-scale chip, or 36×M semiconductor memory chips are arranged on a printed circuit board. It is also possible to use chips, each of which contains some of the memory elements. The following description relates to a case where memory elements are chips. Each row (line) consists of 36 memory elements. An internal (input/output) bus line BUS1 carrying one-bit data is provided in common to the memory chips M(1, 1), M(2, 1), . . . , M(n, 1), which form a column. Similarly, internal bus lines BUS2, BUS3, . . . , BUS36 are provided for the memory chips M(1, 2), . . . , M(n, 36). The internal bus lines BUS1, BUS2, . . . , BUS36 are connected to a 36-bit bus port 21 of a bus line switching circuit 20, which also has a 32-bit bus port 22. A switch circuit 26 is provided between the 36-bit bus port 21 and the 32-bit bus port 22.

The bus line switching circuit 20 is controlled by a controller 24 and a ROM 24a, both of which correspond to the control circuit 6. An address/chip selecting circuit 23 receives an address signal ADD from an external device (not shown) such as a CPU, and selects 36 chips in a designated row and a memory cell of each of the 36 selected chips by the address signal ADD. Data of 36 bits are read out from the selected memory cells and transmitted to the 36-bit bus port 21 through the internal bus lines BUS1 through BUS36. Then, 32 bits are selected from among the 36 bits of the readout data by the switch circuit 26, and are then transmitted to an external bus 25 consisting of 32 external bus lines. Also, 32-bit data passes through the bus line switching circuit 20 and are written into the designated memory cells through the internal bus lines BUS1 through BUS36.

Figure 4:
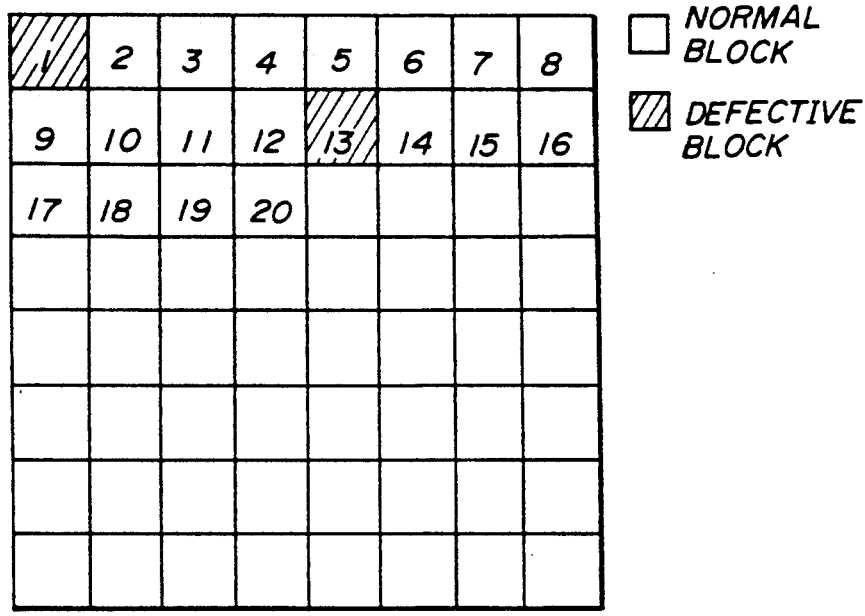
FIG. 4 is a diagram showing how to divide a memory area of a semiconductor memory element used in the configuration shown in FIG. 3 into a plurality of blocks.

The memory area of each of the chips M(1, 1) - M(n, 36) is divided into a plurality of blocks, each of which is composed of a plurality of memory cells. Each memory chip M(1, 1) - M(n, 36) is tested to determine whether each block has a defective memory cell. The results of the test obtained for each of the 36×M chips are stored in the ROM 24a. FIG. 4 illustrates how to divide the memory area of each chip into blocks. In the case in FIG. 4, the memory area is divided into 64 (=8×8) blocks, and it is determined whether each of the 64 blocks has a defective memory cell. The blocks are consecutively numbered. The illustrated case has defective memory cells in the first and thirteenth blocks (hatched blocks). It is noted that the blocks shown in FIG. 4 do not mean that the memory area is physically divided into a mesh.

The ROM 24a stores information indicating whether or not each block of each chip has a defective memory cell in the form of map. FIG. 5 illustrates a map formed in the ROM 24a. The horizontal direction of the map represents numbers of blocks, and the vertical direction thereof represents numbers of chips. Each hatched area indicates a block having a defective memory cell. For example, the first and thirteenth blocks of the chip M(1, 1) have defective memory cells.

The address signal ADD designates one of the rows (lines) each consisting of 36 chips. For example, when the address signal ADD designates the first row, a group of the chips M(1, 1), M(1, 2), . . . , M(1, 36) is designated. The address signal ADD is compared with the contents of the ROM 24a by the controller 24. In this case, when the first block of the chip M(1, 1) is designated, the controller 24 determines that the first block of the chip M(1, 1) has a defective memory cell. Then the controller 24 controls the bus line switching circuit 20 so that it selects, instead of the chip M(1, 1), another chip having no defective memory cell, chip M(1, 36), for example. The bus line switching circuit 20 selects the internal bus line BUS36 and connects it to a corresponding one of the external bus lines 25. Thus, one-bit data is read out from the chip M(1, 36) instead of the chip M(1, 1) and then transmitted to the external bus 25 through the switch circuit 26.

Figure 6:
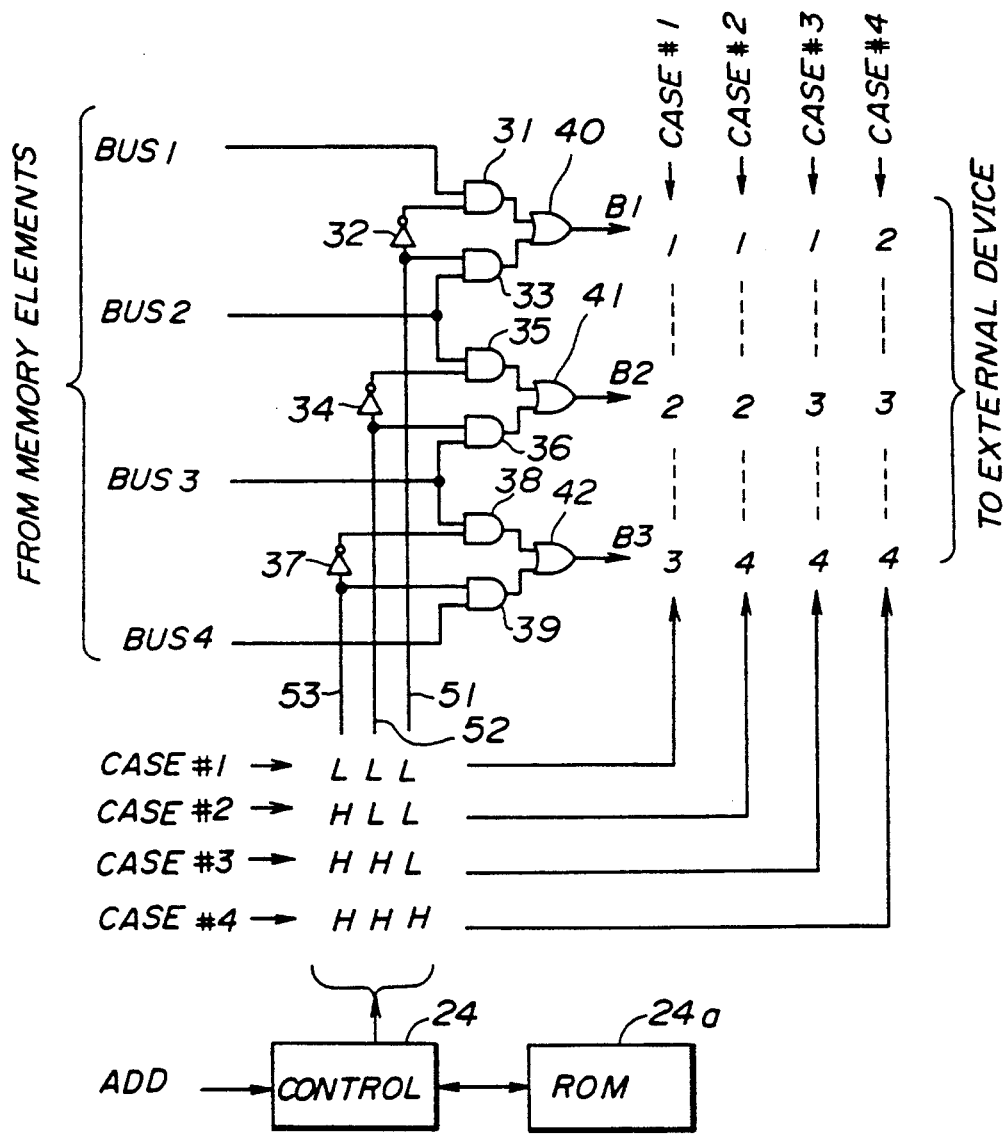
FIG. 6 is a circuit diagram illustrating the principle of a bit line switching circuit shown in FIG. 3.

FIG. 6 is a diagram illustrating the operational principle of the bus line switching circuit 20. It is noted that there is illustrated a configuration capable of converting four bits into three bits for the sake of simplicity. A structure capable of converting 36 bits into 32 bits can be easily obtained on the basis of the configuration shown in FIG. 6. This structure will be described in detail later.

The configuration in FIG. 6 includes an AND gate 31, which receives one-bit data from the internal bus line BUS1 connected to the chips M(1, 1) - M(n, 1). The AND gate 31 also receives a control signal, which is supplied from the controller 24 and passes through an inverter 32 provided on a line 51. An AND gate 33 receives one-bit data from the bus line BUS2 connected to the chips M(1, 2) - M(1, n). The first control signal on the line 51 is input directly to the AND gate 33. The one-bit data on the internal bus line BUS2 is applied to an AND gate 35, which is provided with a second control signal supplied from the controller 24 and passed through an inverter 32 on a line 52. The second control signal is supplied directly to an AND gate 36, which is supplied with one-bit data from the internal bus line BUS3 connected to the chips M(1, 3) - M(n, 3). The one-bit data on the internal bus line BUS3 is also supplied to an AND gate 38, which receives a third control signal supplied from the controller 24 and passing through an inverter 37 on a line 53. The third control signal is supplied directly to an AND gate 39, which also receives one-bit data from the internal bus line BUS4 connected to the chips M(1, 4) - M(1, n).

The output terminals of the AND gates 31 and 33 are connected to an OR gate 40, which is connected to an external bus line B1 of the 32-bit external bus 25. The output terminals of the AND gates 35 and 36 are connected to an OR gate 41, which is connected to an external bus line B2 of the 32-bit external bus 25. The output terminals of the AND gates 38 and 39 are connected to an OR gate 42, which is connected to an external bus line B3 of the 32-bit external bus 25.

The controller 24 generates the first, second and third control signals by comparing the address signal ADD with the contents of the ROM 24a. When the first, second and third control signals are all low (L; hereafter referred to as case #1), the external bus lines B1, B2 and B3 are connected to the internal bus lines BUS1, BUS2 and BUS3, respectively. When the first and second control signals are low and the third control signal is high (H; hereafter referred to as case #2), the external bus lines B1, B2 and B3 are connected to the internal bus lines BUS1, BUS2 and BUS4, respectively. When the first control signal is low and the second and third control signals are both high (hereafter referred to as case #3), the external bus lines B1, B2 and B3 are connected to the internal bus lines BUS1, BUS3 and BUS4, respectively. When the first, second and third control signals are all high (hereafter referred to as case #4), the external bus lines B1, B2 and B3 are connected to the internal bus lines BUS2, BUS3 and BUS4, respectively.

In a case where the ROM 24a shown in FIG. 6 stores data about states of the internal bus lines obtained when a group of blocks is accessed, as shown in Table 1, it is possible to apply the address signal ADD directly to the ROM 24a without using the controller 24.

TABLE 1

| BUS1 | BUS2 | BUS3 | BUS4 | B1 | B2 | B3 | |
|------|------|------|------|----|----|----|----|
| P | P | P | P | 0 | 0 | 0 | (case #1) |
| F | P | P | P | 1 | 1 | 1 | (case #4) |
| P | F | P | P | 0 | 1 | 1 | (case #3) |
| P | P | F | P | 0 | 0 | 1 | (case #2) |
| P | P | P | F | 0 | 0 | 0 | (case #1) |

In Table 1, P indicates "pass (an accessed block has no defective memory cell)", and F indicates "failure (an accessed block has a defective memory cell)".

When the configuration shown in FIG. 6 is extended to a bus line switching structure which selects 32 bits from among 36 bits, it is sufficient for the ROM 24a to have a capacity of (K×n) words by (32×S) bits where K is the number of blocks of each chip, n is the number of chips connected to one internal bus line, S is the maximum number of bits to be shifted, and 32 represents the number of output signals on the external bus 25. When a block having a defective memory cell is accessed in the configuration shown in FIG. 3, it is possible to select another chip connected to one of the internal bus lines BUS1 - BUS32 which is apart, by a maximum of four bits, from the bus line connected to the chip to be replaced. For example, when an accessed block of a chip connected to the internal bus line BUS1 has a defective memory cell, it is possible to select another chip connected to one of the internal bus lines BUS2, BUS3, BUS4 and BUS5. Thus, it is possible to select one of the five internal bus lines BUS1 - BUS5 with respect to the internal bus line BUS1. As a result, S is set to three.

Figure 7:
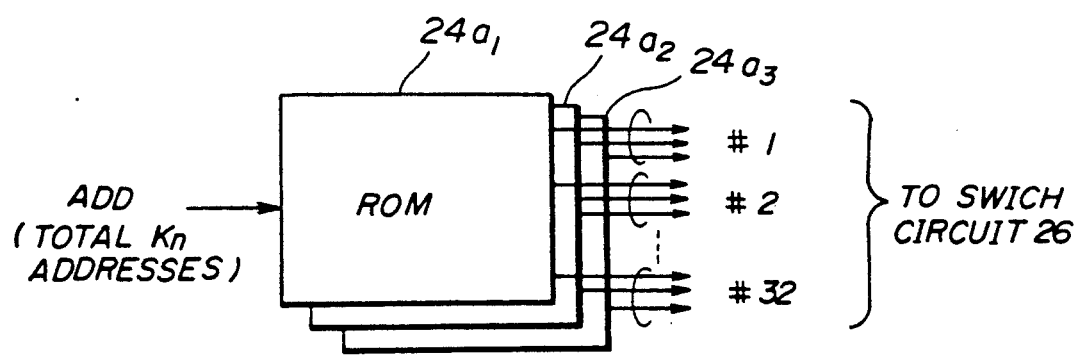
FIG. 7 is a block diagram of a detailed structure of the ROM shown in FIG. 3.

As shown in FIG. 7, the ROM 24a is composed of three ROMs $24a_1$, $24a_2$ and $24a_3$, each of which has outputs equal to 32×3 bits. The address signal ADD showing K×n addresses in total is supplied directly to the ROM 24a, which outputs 32 sets of three-bit data #1, #2, ..., #32.

FIG. 8 is a block diagram of a part of the switch circuit 26 which selects 32 bits from among the 36 bits on the internal bus lines BUS1 - BUS36. The switch circuit 26 includes 32 switches SW1, SW2, SW3, SW4, ..., SW32 (not shown for the sake of simplicity). Each switch $SW_i$ (i=1, 2, ..., 32) is connected to five of the internal bus lines BUS1 - BUS36. For example, the switch SW1 is connected to the internal bus lines BUS1 - BUS5 through input terminals 0 - 4. The switches SW1, SW2, ..., SW32 are supplied with 32 sets of three-bit data (numerical data pieces) #1, #2, ..., #32, respectively, which are derived from the ROM 24a.

When 36 blocks selected from the chips M(n, 1) - M(n, 36) one by one have the status appearing on the internal bus lines BUS1 - BUS36 shown in FIG. 9, the ROM 24a stores data shown in FIG. 9. Numerals of the contents of the ROM 24a shown in FIG. 9 indicate input terminals of the switches SW1 - SW36 shown in FIG. 8. Since the accessed block coupled to the internal bus line BUS4 is defective, the corresponding switch SW4 selects input terminal 1 instead of input terminal 0, that is, selects the internal bus line BUS5 instead of the internal bus line BUS4. In this manner, each time "IF" appears, the value of data in the ROM 24a is incremented by +1. In FIG. 9, three "IF"s appear on the internal bus lines BUS4, BUS10 and BUS12. Thus, the chips connected to the internal bus lines BUS33, BUS34 and BUS35 are selected instead of those connected to the internal bus lines BUS4, BUS10 and BUS12. The chip connected to the internal bus line BUS36 is not selected.

The relationship shown in FIG. 9 is summarized as follows. When one of the ROM storage areas corresponding to the i-th external bus line $B_i$ (i=1, 2, ...) indicates the j-th input terminal (j=0, 1, 2, ...), the i-th switch $SW_i$ connected to the i-th external bus line $B_i$ selects the (i+j)-th internal bus line $BUS_{i+j}$.

Figure 10:
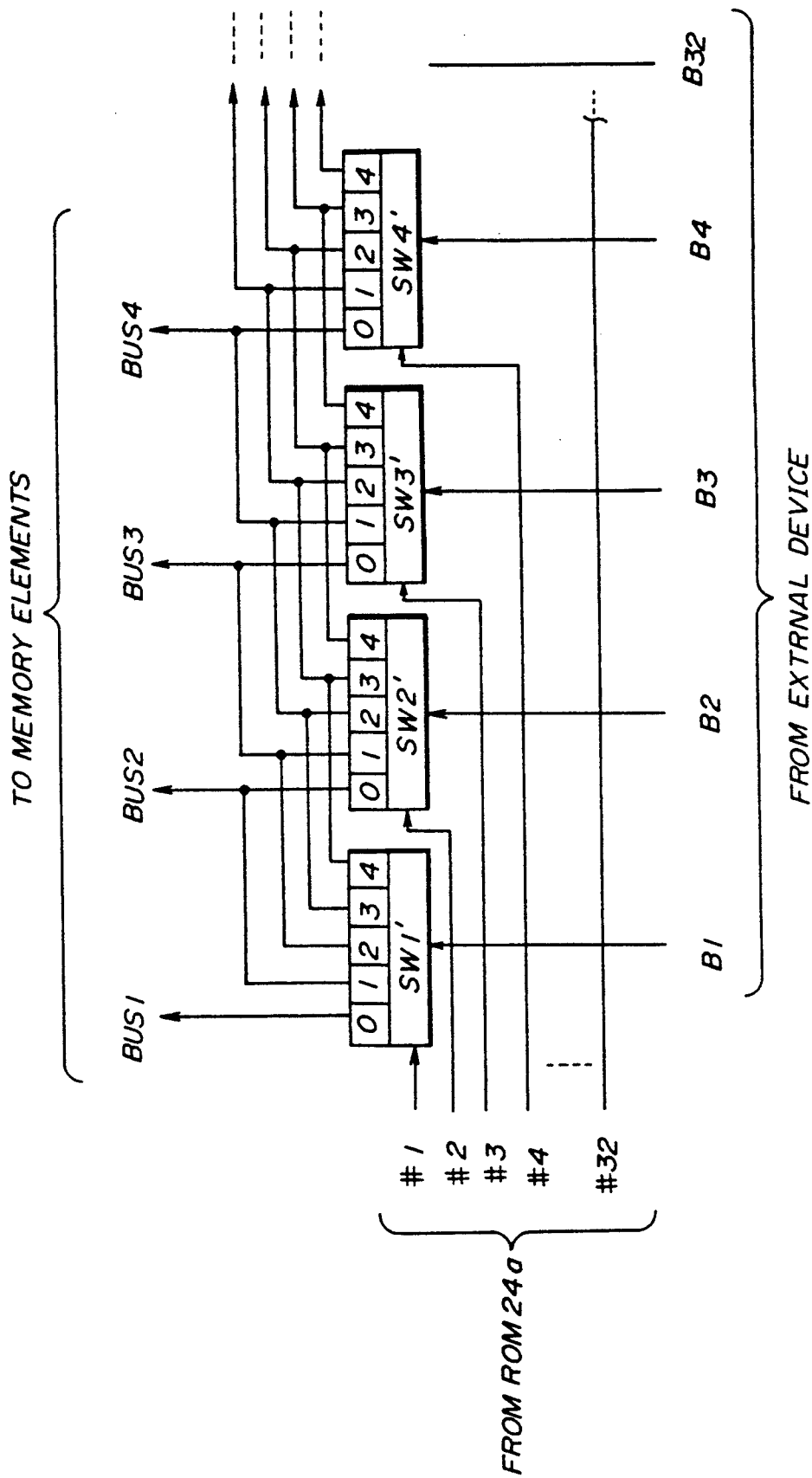
FIG. 10 is a block diagram of a part of the switch circuit provided in the bit line switching circuit shown in FIG. 3.

FIG. 10 is a block diagram of a configuration of the switch circuit 26 which passes 32-bit data from the external bus lines B1 - B32 to the 36 internal bus lines BUS1 to BUS36. It can be seen from the comparison between FIG. 8 and FIG. 10 and a comparison between FIG. 9 and FIG. 11 that the configuration shown in FIG. 10 has a reversed version of the logic achieved by the configuration shown in FIG. 8. Switches SW1' through SW32' are supplied with the three-bit data #1 through #32 from the ROM 24a, respectively.

It is possible to divide the memory area of each chip into blocks only in the row direction or column direction. In this case, each block has a one-dimensional memory area. The aforementioned embodiment has 36 internal bus lines BUS1 - BUS36 and 32 external bus lines B1 - B32 so that there is a margin equal to four bits. The present invention is not limited to the four-bit margin. When the memory elements M(1, 1) - M(n, 1) are formed by memory chips, it is preferable that the arrangement of elements be studded with blocks having defective memory cells. For example, when the first block of the chip M(1, 1) has a defective memory cell, it is preferable that the first blocks of the other chips M(1, 2) - M(1, 36) of the same row do not have any defective memory cells. With this arrangement, it is possible to use a small number of margin bits and configure the semiconductor memory device effectively and efficiently.

Figure 12:
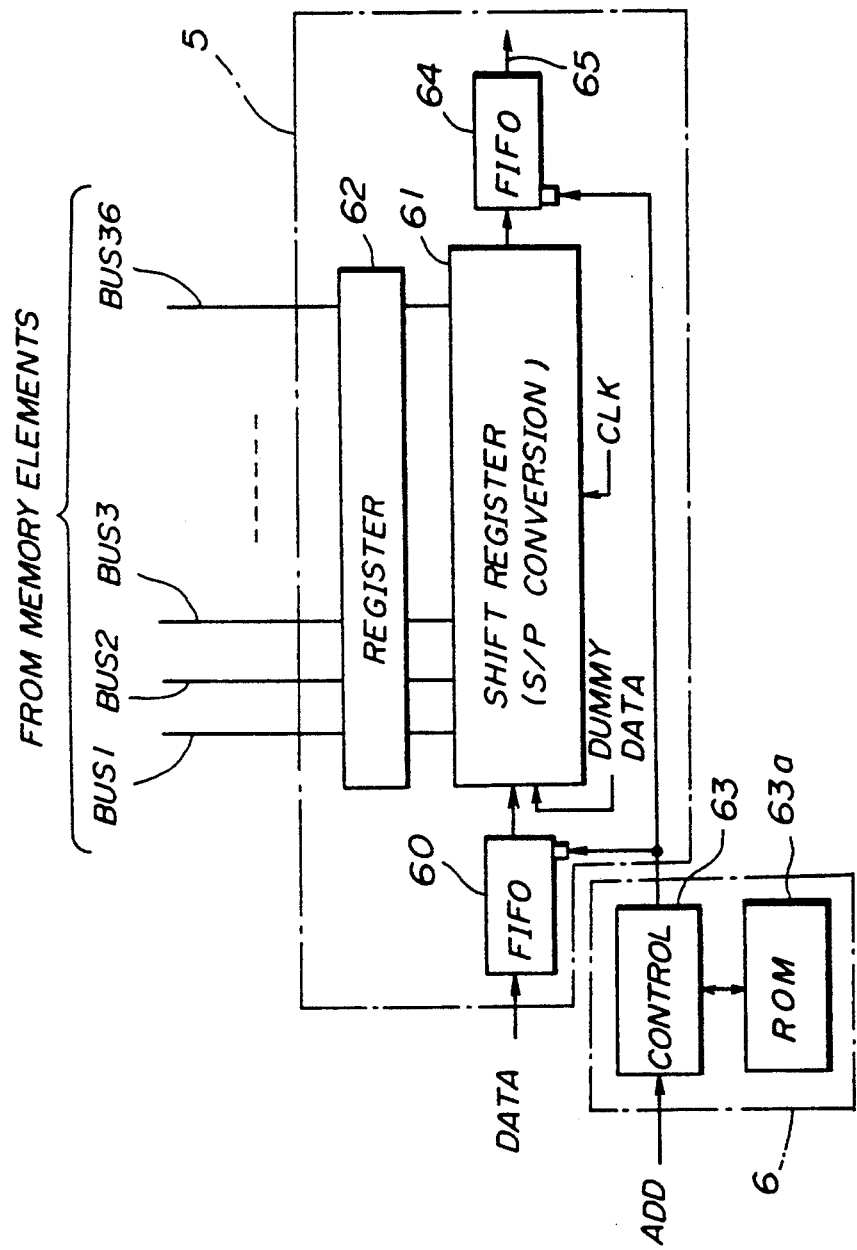
FIG. 12 is a block diagram of a bit line switching circuit according to a second preferred embodiment of the present invention.

A description will be given of a second preferred embodiment of the present invention with reference to FIG. 12. The bus line switching circuit 5 is made up of a shift register 61 functioning as a serial/parallel converter, a register 62, and two first-in first-out (FIFO) memories 60 and 64. The FIFO memories 60 and 64 are controlled by the control circuit 6, which is composed of a controller 63 and a ROM 63a. The shift register 61 operates in synchronism with a clock signal CLK. During writing of data into the memory device, 32-bit write data in serial form is successively written into the FIFO memory 60. The controller 63 receives the address signal ADD and compares it with the contents of the ROM 63a. When it is determined that one-bit data to be output next to the shift register 61 is to be written into a block having a defective memory cell, the controller 63 stops the FIFO 60 outputting the above one-bit data and controls the shift register 61 so that it inputs dummy data. Then, the controller 63 starts to output one-bit data to the shift register 61. In this manner, data to be written into a block having no defective memory cell is output to the shift register 61 from the FIFO memory 60, and data to be written into a block having a defective memory cell is not output and instead dummy data is written into the shift register 61.

During reading out of data from the memory device, 36-bit data are serially input to the shift register 61 via the register 62, and then read out from the shift register 61 bit by bit. Data from the shift register 61 is supplied to the FIFO memory 64 in synchronism with the clock signal CLK. The FIFO memory 64 is controlled by the controller 63 so that when one-bit data from a block having a defective memory cell is supplied to the FIFO memory 64, the FIFO memory 64 is disabled. That is, the inputting of data from the shift register 61 is selectively prevented. Thus, correct 32-bit data is output to an output line 65 in serial form.

Figure 13:
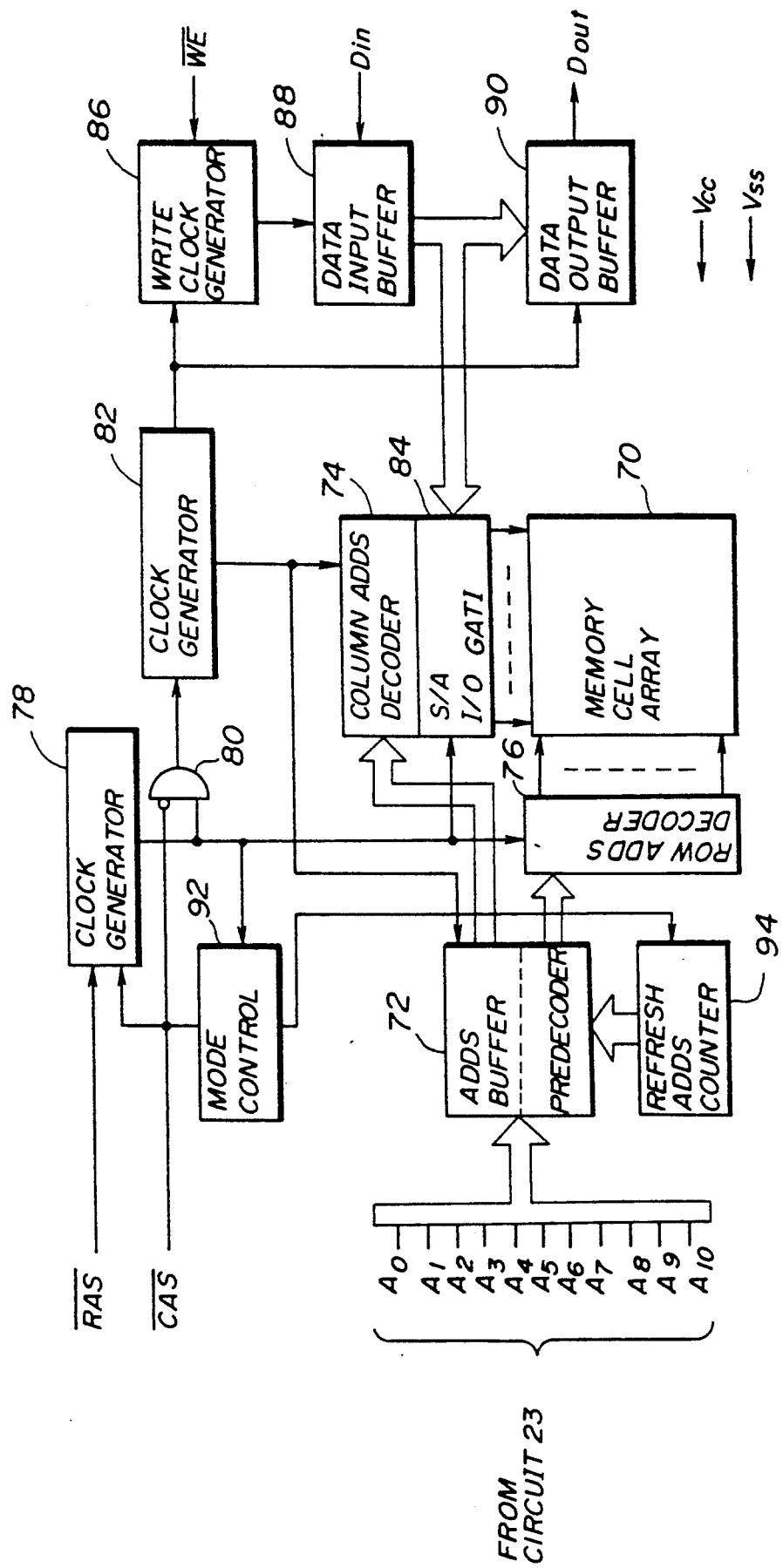
FIG. 13 is a block diagram of each semiconductor memory element shown in FIG. 3.

Referring to FIG. 13, there is illustrated the entire structure of each memory element M(1, 1) - M(n, 36). As shown in FIG. 13, each memory element is formed by a dynamic random access memory (DRAM). The DRAM includes a memory cell array 70, which has a plurality of memory cells arranged into a matrix and coupled to word lines and bit lines.

A multiplexed address signal consisting of address bits $A_0$ to $A_{10}$ is input to an address buffer/predecoder 72, which generates a column address signal to be supplied to a column address decoder 74 and a row address signal to be supplied to a row address decoder 76. The multiplexed address signal is one of the signals from the address/chip selecting circuit 23 shown in FIG. 3. A row address strobe signal $\overline{RAS}$ from an external device (not shown) such as a central processing unit (CPU) is input to a clock generator 78, which generates a clock signal to be supplied to the row address decoder 76. The row address strobe signal $\overline{RAS}$ is a low-active signal and defines a time at which at least one of the word lines is selected by the row address decoder 76, and a time at which at least a selected one of the word lines is released from the selected state. The row address strobe signal $\overline{RAS}$ defines a time at which the word lines are precharged and a time at which the word lines are reset. A sense amplifier and input/output gate 84 is connected to the column address decoder 74 and the memory cell array 70.

A column address strobe signal $\overline{CAS}$ from the external device is input to an AND gate 80 through an inverter. The clock signal from the clock generator 78 is applied to the AND gate 80, an output signal of which is input to a clock generator 82. In response to the column address strobe signal $\overline{CAS}$, the clock generator 82 generates a clock signal to be supplied to the column address decoder 74 as well as the address buffer/predecoder 72. Upon receiving the clock signal from the clock generator 82, the column address decoder 74 selects a one or more corresponding pairs of bit lines. The sense amplifier and input/output gate 84 are coupled to the bit lines extending to the memory cell array 70. When writing data Din into the memory cell array 70 or reading out data Dout therefrom, the data is amplified by a sense amplifier provided in the sense amplifier and input/output gate 84.

A write clock generator 86 receives the clock signal from the clock generator 82 and a write enable signal $\overline{WE}$ supplied from the external device, and generates a write clock. A data input buffer 88 inputs data Din at a time defined by the write clock supplied from the write clock generator 86. Data output from the data input buffer 88 is input to the sense amplifier and input/output gate 84 and is written into the memory cell array 70. Data output from the sense amplifier and input/output gate 84 is input to a data output buffer 90, which outputs the input data in synchronism with the clock signal from the clock generator 82. A mode controller 92 receives the column address strobe signal $\overline{CAS}$ and the clock signal from the clock generator 78, and generates a mode signal corresponding to predetermined conventional operation modes, such as a read/write mode or a rewrite mode. The mode signal from the mode controller 92 is input to a refresh address counter 94, which generates an address signal relating to a memory cell to be refreshed. Each memory element is not limited to a DRAM and may be formed by another type of memory element such as a static random access memory (SRAM).

The present invention is not limited to the specifically described embodiments, and variations and modifications may be made without departing from the scope of the present invention.

What is claimed is:

1. A semiconductor memory device storing data having a unit of N bits (N is an integer), comprising:
   M alternate memory elements having a plurality of memory cells (M is an integer and larger than N), each of said alternate memory elements being divided into a plurality of blocks, each of said memory blocks having a plurality of said memory cells in at least one column, and each of said memory cells storing one-bit data;
   M first bus lines each carrying one-bit data and connected to a corresponding one of said M alternate memory elements;
   designating means, coupled to said M alternate memory elements, for receiving an address signal from an external device and for designating one of said plurality of blocks of each of said M alternate memory elements so that at least M blocks are designated by said address signal;
   memory means for storing information on whether or not each of said plurality of blocks of each of said M alternate memory elements has a defective memory cell and for outputting said information in accordance with said address signal;

N second bus lines each carrying one-bit data; and bus line switching means, provided between said M first bus lines and N second bus lines and connected to said memory means, for determining whether each of said at least M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said M alternate memory elements is selected, said bus line switching means including N switches each connected between L (L is an integer and $L<N<M$) internal bus lines among said M internal bus lines and one of said N external bus lines, each of said N switches connecting one of said L internal bus lines to said one of said N external bus lines in accordance with said information supplied from said memory means.

2. A semiconductor memory device storing data having a unit of N bits (N is an integer), comprising:

M alternate memory elements having a plurality of memory cells (M is an integer and larger than N), wherein each of said alternate memory elements are divided into a plurality of blocks, wherein each of said blocks have a plurality of said memory cells, and wherein each of said memory cells stores one-bit data;

M first bus lines each carrying one-bit data and connected to a corresponding one of said M alternate memory elements;

designating means, coupled to said M alternate memory elements, for receiving an address signal from an external device and for designating one of said plurality of blocks of each of said M alternate memory elements so that at least M blocks are designated by said address signal;

memory means for storing information on whether or not each of said plurality of blocks of each of said M alternate memory elements has a defective memory cell and for outputting said information in accordance with said address signal;

N second bus lines each carrying one-bit data; and bus line switching means, provided between said M first bus lines and N second bus lines and connected to said memory means, for determining whether each of said M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said M alternate memory elements is selected; and wherein each of said M alternate memory elements has said plurality of blocks arranged into a matrix.

3. A semiconductor memory device storing data having a unit of N bits (N is an integer), comprising:

M alternate memory elements having a plurality of memory cells (M is an integer and larger than N), wherein each of said alternate memory elements are divided into a plurality of blocks, wherein each of said blocks have a plurality of said memory cells, and wherein each of said memory cells stores one-bit data;

M first bus lines each carrying one-bit data and connected to a corresponding one of said M alternate memory elements;

designating means, coupled to said M alternate memory elements, for receiving an address signal from an external device and for designating one of said plurality of blocks of each of said M alternate memory elements so that at least M blocks are designated by said address signal;

memory means for storing information on whether or not each of said plurality of blocks of each of said M alternate memory elements has a defective memory cell and for outputting said information in accordance with said address signal;

N second bus lines each carrying one-bit data; and bus line switching means, provided between said M first bus lines and N second bus lines and connected to said memory means, for determining whether each of said M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said M alternate memory elements is selected; and wherein each of said M alternate memory elements is formed of a memory chip, and wherein said semiconductor memory device comprises a printed circuit board on which said M alternate memory elements are mounted.

4. A semiconductor memory device storing data having a unit of N bits (N is an integer), comprising:

M alternate memory elements having a plurality of memory cells (M is an integer and larger than N), wherein each of said alternate memory elements are divided into a plurality of blocks, wherein each of said blocks have a plurality of said memory cells, and wherein each of said memory cells stores one-bit data;

M first bus lines each carrying one-bit data and connected to a corresponding one of said M alternate memory elements;

designating means, coupled to said M alternate memory elements, for receiving an address signal from an external device and for designating one of said plurality of blocks of each of said M alternate memory elements so that at least M blocks are designated by said address signal;

memory means for storing information on whether or not each of said plurality of blocks of each of said M alternate memory elements has a defective memory cell and for outputting said information in accordance with said address signal;

N second bus lines each carrying one-bit data; and bus line switching means, provided between said M first bus lines and N second bus lines and connected to said memory means, for determining whether each of said M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said M alternate memory elements is selected; and wherein each of said M alternate memory elements is formed of an integrated circuit block, and wherein said semiconductor memory device comprises a wafer-scale chip on which said M alternate memory elements are formed.

5. A semiconductor memory device storing data having a unit of N bits (N is an integer), comprising:

n×M alternate memory elements each having a plurality of memory cells (n being an integer, and M being an integer and larger than N), each of said alternate memory elements being divided into a plurality of blocks, each of said blocks having a plurality of said memory cells in at least one column, and each of said memory cells storing one-bit data;

M first bus lines each carrying one-bit data and connected to corresponding n memory elements among said n×M alternate memory elements so that said n×M alternate memory elements are arranged into a matrix;

designating means, coupled to said n×M alternate memory elements, for receiving an address signal from an external device and for designating one of said plurality of blocks of each of said n×M alternate memory elements so that at least M blocks are designated by said address signal;

memory means for storing information on whether or not each of said plurality of blocks of each of said n×M alternate memory elements has a defective memory cell and for outputting said information in accordance with said address signal;

N second bus lines each carrying one-bit data; and bus line switching means, provided between said M first bus lines and N second bus lines and connected to said memory means, for determining whether each of said at least M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said n×M alternate memory elements is selected, said bus line switching means including N switches each connected between L (L is an integer and L<N<M) internal bus lines among said M internal bus lines and one of said N external bus lines, each of said N switches connecting one of said L internal bus lines to said one of said N external bus lines in accordance with said information supplied from said memory means.

6. A semiconductor memory device storing data having a unit of N bits (N is an integer), comprising:

n×M alternate memory elements (n being an integer, and M being an integer and larger than N), wherein each of said alternate memory elements are divided into a plurality of blocks, wherein each of said blocks have a plurality of said memory cells, and wherein each of said memory cells stores one-bit data;

M first bus lines each carrying one-bit data and connected to corresponding n memory elements among said n×M alternate memory elements so that said n×M alternate memory elements are arranged into a matrix;

designating means, coupled to said n×M alternate memory elements, for receiving an address signal from an external device and for designating one of said plurality of blocks of each of said n×M alternate memory elements so that at least M blocks are designated by said address signal;

memory means for storing information on whether or not each of said plurality of blocks of each of said n×M alternate memory elements has a defective memory cell and for outputting said information in accordance with said address signal;

N second bus lines each carrying one-bit data; and bus line switching means, provided between said M first bus lines and N second bus lines and connected to said memory means, for determining whether each of said M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said n×M alternate memory elements is selected; and wherein each of said n×M alternate memory elements has said plurality of blocks arranged into a matrix.

7. A semiconductor memory device storing data having a unit of N bits (N is an integer), comprising:

n×M alternate memory elements (n being an integer, and M being an integer and larger than N), wherein each of said alternate memory elements are divided into a plurality of blocks, wherein each of said memory blocks have a plurality of said memory cells, and wherein each of said memory cells stores one-bit data;

M first bus lines each carrying one-bit data and connected to corresponding n memory elements among said n×M alternate memory elements so that said n×M alternate memory elements are arranged into a matrix;

designating means, coupled to said n×M alternate memory elements, for receiving an address signal from an external device and for designating one of said plurality of blocks of each of said n×M alternate memory elements so that at least M blocks are designated by said address signal;

determining means, connected to said memory means, for determining whether each of said M blocks designated by said designating means has a defective memory cell by referring to said information from said memory means and for outputting a control signal indicative of the results of the determination;

serial data inputting means, coupled to said determining means, for receiving serial write data and for selectively outputting said serial write data bit by bit to the blocks of said n×M alternate memory elements not having a defective memory cell in the blocks designated by said designating means in accordance with said control signal from said determining means;

serial/parallel converting means, connected to said M first bus lines and said serial data inputting means, for converting said serial write data into parallel write data to be supplied to said M first bus lines and for converting readout data from said M first bus lines into serial readout data; and serial data outputting means, coupled to said determining means and said serial/parallel converting means, for selectively receiving said serial readout data bit by bit in accordance with said control signal from said determining means and for outputting said serial readout data to an second bus line in serial form.

8. A semiconductor memory device as claimed in claim 7, wherein said serial data inputting means outputs said serial write data until said control signal shows that said serial write data is to be written into one of said M blocks which has a defective memory cell, and wherein dummy data is written into said one of the M blocks instead of said serial write data.

9. A semiconductor memory device as claimed in claim 7, wherein said serial data outputting means stops outputting said serial readout data when said control signal shows that said serial write data is read out from one of said M blocks which has a defective memory cell.

10. A semiconductor memory device as claimed in claim 6, wherein each of said n×M memory elements has said plurality of blocks arranged into a matrix.

11. A semiconductor memory device storing data having a unit of N bits (N is an integer), comprising:
M memory elements (M is an integer and larger than N) each divided into a plurality of blocks each having a plurality of memory cells each storing one-bit data;
M first bus lines each carrying one-bit data and connected to a corresponding one of said M memory elements;
designating means, coupled to said M memory elements, for receiving an address signal from an external device and for designating one of said plurality of blocks of each of said M memory elements so that M blocks are designated by said address signal;
memory means for storing information on whether or not each of said plurality of blocks of each of said M memory elements has a defective memory cell and for outputting said information in accordance with said address signal, wherein said information stored in said memory means includes control data indicating which one of L first bus lines among said M first bus lines is to be selected on the basis of whether or not each of said M memory blocks of said M memory elements has a defective memory cell, wherein said control data includes N numerical data pieces provided for every M blocks and corresponding to said N second bus lines, and each of said N numerical data pieces related to a corresponding one of said N second bus lines indicates which one of said L input terminals is to be connected to said corresponding one of said N second bus lines;
N second bus lines each carrying one-bit data; and
bus line switching means, provided between said M first bus lines and N second bus lines and connected to said memory means, for determining whether each of said M blocks designated by said designating means has a defective memory cell by referring to said information from said memory means and for selectively connecting N first bus lines among said M first bus lines to said N second bus lines so that one of said M blocks which has a defective memory cell is prevented from being selected and another one of said M blocks is selected, wherein said bus line switching means comprises N switches each connected between L (L is an integer and L<N<M) first bus lines among said M first bus lines and one of said N second bus lines, wherein each of said switches has L input terminals to which said L first bus lines are connected, each of said N switches connecting one of said L first bus lines to said one of said N second bus lines in accordance with said information supplied from said memory means; and
wherein said memory means has storage areas provided for said N numerical data pieces and wherein when one of said storage areas of said memory means corresponding to an i-th second bus line (i=1, 2, . . . ) of said N second bus line indicates a j-th input terminal (j=0, 1, 2, . . . ) of said L input terminals, an i-th switch of said N switches which is connected to an i-th second bus line of said N second bus lines selects an (i+j)-th first bus line of said M first bus lines.

12. A semiconductor memory device storing data having a unit of N bits (N is an integer), comprising:
n×M memory elements (n being an integer, and M being an integer and larger than N) each divided into a plurality of blocks each having a plurality of memory cells each storing one-bit data;
M first bus lines each carrying one-bit data and connected to corresponding n memory elements among said n×M memory elements so that said n×M memory elements are arranged into a matrix;
designating means, coupled to said n×M memory elements, for receiving an address signal from an external device and for designating one of said plurality of blocks of each of said n×M memory elements so that M blocks are designated by said address signal;
memory means for storing information on whether or not each of said plurality of blocks of each of said n×M memory elements has a defective memory cell and for outputting said information in accordance with said address signal, wherein said information stored in said memory means includes control data indicating which one of L first bus lines among said M first bus lines is to be selected on the basis of whether or not each of said M memory blocks of each of said n×M memory elements has a defective memory cell, wherein said control data includes N numerical data pieces provided for every M blocks and corresponding to said N second bus lines, and each of said N numerical data pieces related to a corresponding one of said N second bus lines indicates which one of said L input terminals is to be connected to said corresponding one of said N second bus lines;
N second bus lines each carrying one-bit data; and
bus lines switching means, provided between said M first bus lines and N second bus lines and connected to said memory means, for determining whether each of said M blocks designated by said designating means has a defective memory cell by referring to said information from said memory means and for selectively connecting N first bus lines among said M first bus lines to said N second bus lines so that one of said M blocks which has a defective memory cell is prevented from being selected and another one of said M blocks is selected, wherein said bus line switching means comprises N switches each connected between L (L is an integer and L<N<M) first bus lines among said M first bus lines and one of said N second bus lines, wherein each of said switches has L input terminals to which said L first bus lines are connected, each of said N switches connecting one of said L first bus lines to said one of said N second bus lines in accordance with said information supplied from said memory means; and wherein said memory means has storage areas provided for said N numerical data pieces and wherein when one of said storage areas of said memory means corresponding to an i-th second bus line (i=1, 2, ...) of said N second bus lines indicates a j-th input terminal (j=0, 1, 2, ...) of said L input terminals, an i-th switch of said N switches which is connected to an i-th second bus line of said N second bus lines selects an (i+j)-th first bus line of said M first bus lines.

13. A semiconductor memory device storing data having a unit of N bits (N is an integer), comprising:

n×M memory elements (n being an integer, and M being an integer and larger than N) each divided into a plurality of blocks each having a plurality of memory cells each storing one-bit data;

M first bus lines each carrying one-bit data and connected to corresponding n memory elements among said n×M memory elements so that said n×M memory elements are arranged into a matrix;

designating means, coupled to said n×M memory elements, for receiving an address signal from an external device and for designating one of said plurality of blocks of each of said n×M memory elements so that M blocks are designated by said address signal;

memory means for storing information on whether or not each of said plurality of blocks of each of said n×M memory elements has a defective memory cell and for outputting said information in accordance with said address signal;

determining means, connected to said memory means, for determining whether each of said M blocks designated by said designating means has a defective memory cell by referring to said information from said memory means and for outputting a control signal indicative of the results of the determination;

serial data inputting means, coupled to said determining means, for receiving serial write data and for selectively outputting said serial write data bit by bit to the blocks of said n×M alternate memory elements not having a defective memory cell in the blocks designated by said designating means in accordance with said control signal from said determining means by outputting said serial write data until said control signal shows that said serial write data is to be written into one of said M blocks which has a defective memory cell and by writing dummy data instead of said serial data into said one of the M blocks which has the defective memory cell;

serial parallel converting means, connected to said M first bus lines and said serial data inputting means, for converting said serial write data into parallel write data to be supplied to said M first bus lines and for converting readout data from said M first bus lines into serial readout data; and serial data outputting means, coupled to said determining means and said serial/parallel converting means, for selectively receiving said serial readout data bit by bit in accordance with said control signal from said determining means and for outputting said serial readout data to an second bus line in serial form.

14. A semiconductor memory device storing data having a unit of N bits (N is an integer), comprising:

M alternate memory elements having a plurality of memory cells (M is an integer and larger than N), wherein each of said alternate memory elements are divided into a plurality of blocks, wherein each of said memory blocks have a plurality of said memory cells, and wherein each of said memory cells stores one-bit data;

M first bus lines each carrying one-bit data and connected to a corresponding one of said M alternate memory elements;

designating means, coupled to said M alternate memory elements, for receiving an address signal from an external device and for designating one of said plurality of blocks of each of said M alternate memory elements so that M blocks are designated by said address signal;

memory means for storing information on whether or not each of said plurality of blocks of each of said M alternate memory elements has a defective memory cell and for outputting said information in accordance with said address signal;

N second bus lines each carrying one-bit data;

bus line switching means, provided between said M first bus lines and N second bus lines and connected to said memory means, for determining whether each of said M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said M alternate memory elements is selected; and wherein said bus line switching means comprises N switches each connected between L (L is an integer and L<N<M) first bus lines among said M first bus lines and one of said N second bus lines, each of said N switches connecting one of said L first bus lines to said one of said N second bus lines in accordance with said information supplied from said memory means.

15. A semiconductor memory device as claimed in claim 14, wherein said information stored in said memory means includes control data indicating which one of said L first bus lines is to be selected on the basis of whether or not each of said M memory blocks of each of said M alternate memory elements has a defective memory cell.

16. A semiconductor memory device as claimed in claim 14, wherein each of said switches has L input terminals to which said L internal bus lines are connected, and said L internal bus lines are adjacent to each other.

17. A semiconductor memory device as claimed in claim 16, wherein said control data includes N numerical data pieces provided for every M blocks and corresponding to said N external bus lines, and each of said N numerical data pieces related to a corresponding one of said N external bus lines indicates which one of said L input terminals is to be connected to said corresponding one of said N external bus lines.

18. A semiconductor memory device as claimed in claim 17, wherein said memory means has storage areas provided for said N numerical data pieces and wherein when one of said storage areas of said memory means corresponding to an i-th external bus line (i=1, 2, ...) of said N external bus line indicates a j-th input terminal (i=0, 1, 2, ...) of said L input terminal, an i-th switch of said N switches which is connected to an i-th external bus line of said N external bus lines selects an (i+j)-th internal bus line of said M internal bus lines.

19. A semiconductor memory device storing data having a unit of N bits (N is an integer), comprising:

n×M alternate memory elements (n being an integer, and M being an integer and larger than N), wherein each of said alternate memory elements are divided into a plurality of blocks, wherein each of said memory blocks have a plurality of said memory cells, and wherein each of said memory cells stores one-bit data;

M first bus lines each carrying one-bit data and connected to corresponding n memory elements among said n×M alternate memory elements so that said n×M alternate memory elements are arranged into a matrix;

designating means, coupled to said n×M alternate memory elements, for receiving an address signal from an external device and for designating one of said plurality of blocks of each of said n×M alternate memory elements so that at least M blocks are designated by said address signal;

memory means for storing information on whether or not each of said plurality of blocks of each of said n×M alternate memory elements has a defective memory cell and for outputting said information in accordance with said address signal;

N second bus lines each carrying one-bit data;

bus line switching means, provided between said M first bus lines and N second bus lines and connected to said memory means, for determining whether each of said M blocks designated by said designating means has a defective memory cell by referring to said information from said memory means and for selectively connecting N of said M first bus lines to said N second bus lines so that one of said M blocks which has a defective memory cell is prevented from being selected and so that an alternate one of said M blocks of an alternate one of said n×M alternate memory elements is selected; and wherein said bus line switching means comprises N switches each connected between L (L is an integer and L<N<N) first bus lines among said M first bus lines and one of said N second bus lines, each of said N switches connecting one of said L first bus lines to said one of said N second bus lines in accordance with said information supplied from said memory means.

20. A semiconductor memory device as claimed in claim 19, wherein said information stored in said memory means includes control data indicating which one of said L first bus lines is to be selected on the basis of whether or not each of said M memory blocks of each of said n×M alternate memory elements has a defective memory cell.

21. A semiconductor memory device as claimed in claim 19, wherein each of said switches has L input terminals to which said L internal bus lines are connected, and said L internal bus lines are adjacent to each other.

22. A semiconductor memory device as claimed in claim 21, wherein said control data includes N numerical data pieces provided for every M blocks and corresponding to said N external bus lines, and each of said N numerical data pieces related to a corresponding one of said N external bus lines indicates which one of said L input terminals is to be connected to said corresponding one of said N external bus lines.

23. A semiconductor memory device as claimed in claim 22, wherein said memory means has storage areas provided for said N numerical data pieces and wherein when one of said storage areas of said memory means corresponding to an i-th external bus line (i=1, 2, ...) of said N external bus line indicates a j-th input terminal (j=0, 1, 2, ...) of said L input terminal, an i-th switch of said N switches which is connected to an i-th external bus line of said N external bus lines selects an (i+j)-th internal bus line of said M internal bus lines.

* * * * *

UNITED STATES PATENT AND TRADEMARK OFFICE
CERTIFICATE OF CORRECTION

PATENT NO. : 5,303,192
DATED : April 12, 1994
INVENTOR(S) : Fumio BABA

It is certified that error appears in the above-indentified patent and that said Letters Patent is hereby corrected as shown below:

On the cover page, [30] Foreign Application Priority Date, change "Mar. 14, 1990" to --March 20, 1989--.

Col. 8, line 29, change ""IF"" to --"F"--;
line 31, change ""IF"s" to --"F"s--.

Col. 17, line 55, after "serial" insert --write--.

Col. 18, line 19, after "that" insert --at least--.

Signed and Sealed this

Eleventh Day of October, 1994

Attest:

BRUCE LEHMAN

Attesting Officer  Commissioner of Patents and Trademarks